(12) United States Patent
Kho

(10) Patent No.: US 6,523,049 B1
(45) Date of Patent: Feb. 18, 2003

(54) CIRCUIT AND METHOD FOR DETERMINING GREATER THAN OR EQUAL TO THREE OUT OF SIXTY-SIX

(75) Inventor: Rex N. Kho, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,136

(22) Filed: Dec. 21, 1999

(51) Int. Cl.⁷ ................................................ G06F 7/00
(52) U.S. Cl. ...................................................... 708/200
(58) Field of Search ............................... 708/200, 210, 708/625, 628–630, 708–709

(56) References Cited

U.S. PATENT DOCUMENTS

| | | | |
|---|---|---|---|
| 4,138,731 A | 2/1979 | Kamimoto et al. | |
| 4,573,137 A | 2/1986 | Ohhashi | |
| 4,752,905 A | * 6/1988 | Nakagawa et al. | 708/625 |
| 4,758,974 A | 7/1988 | Fields et al. | |
| 4,868,778 A | * 9/1989 | Disbrow | 708/625 |
| 4,901,270 A | * 2/1990 | Galbi et al. | 708/708 |
| 4,924,423 A | 5/1990 | Vassiliadis et al. | |
| 4,974,188 A | 11/1990 | Dolecek | |
| 4,991,131 A | 2/1991 | Yeh et al. | |
| 5,027,311 A | 6/1991 | Zion | |
| 5,095,458 A | 3/1992 | Lynch et al. | |
| 5,122,982 A | 6/1992 | Cohn | |
| 5,163,020 A | 11/1992 | Chau | |
| 5,272,662 A | 12/1993 | Scriber et al. | |
| 5,367,691 A | 11/1994 | Johnson | |
| 5,402,369 A | 3/1995 | Main | |
| 5,426,598 A | * 6/1995 | Hagihara | 708/627 |
| 5,491,653 A | * 2/1996 | Taborn et al. | 708/708 |
| 5,497,342 A | * 3/1996 | Mou et al. | 708/708 |
| 5,619,442 A | 4/1997 | Opris | |
| 5,877,973 A | 3/1999 | Kato et al. | |
| 5,903,484 A | * 5/1999 | Tsujihashi | 708/620 |

* cited by examiner

*Primary Examiner*—Tan V. Mai
(74) *Attorney, Agent, or Firm*—McGinn & Gibb, PLLC; Richard A. Henkler, Esq.

(57) ABSTRACT

A device and method are provided for indicating a status of sixty-six input signals. The device may include a plurality of pre-sum circuits that receive the sixty-six input signals. Each pre-sum circuit may output two pre-sum output signals. The device may also include a plurality of first stage circuits. Each first stage circuit may receive two pre-sum output signals and output two first stage output signals. The device may also include a plurality of second stage circuits adapted to receive the first stage output signals. Each of the second stage circuits may output second stage output signals. A final stage circuit may be adapted to receive the second stage output signals and output two final stage output signals. The two final stage output signals represents the status of the sixty-six input signals such as whether at least three of the input lines have failed.

18 Claims, 8 Drawing Sheets

| A | B | C | O1 | O2 | # OF INPUT LINES SET LOW |
|---|---|---|----|----|--------------------------|
| 1 | 1 | 1 | 0  | 0  | 0 |
| 1 | 1 | 0 | 0  | 1  | 1 |
| 1 | 0 | 1 | 0  | 1  | 1 |
| 1 | 0 | 0 | 1  | 1  | 2 |
| 0 | 1 | 1 | 0  | 1  | 1 |
| 0 | 1 | 0 | 1  | 1  | 2 |
| 0 | 0 | 1 | 1  | 1  | 2 |
| 0 | 0 | 0 | 1  | 0  | 3 |

| D | E | F | G | H | I | O1 | O2 | SUM |
|---|---|---|---|---|---|----|----|-----|
| 0 | 0 | 0 | 0 | 0 | 0 | 0 | 0 | 0 |
| 0 | 0 | 0 | 0 | 0 | 1 | 0 | 1 | 1 |
| 0 | 0 | 0 | 0 | 1 | 1 | 1 | 1 | 2 |
| 0 | 0 | 0 | 0 | 1 | 0 | 1 | 0 | 3 |
| 0 | 0 | 0 | 1 | 0 | 0 | 0 | 1 | 1 |
| 0 | 0 | 0 | 1 | 0 | 1 | 1 | 1 | 2 |
| 0 | 0 | 0 | 1 | 1 | 1 | 1 | 0 | 3 |
| 0 | 0 | 0 | 1 | 1 | 0 | 1 | 0 | 3 |
| 0 | 0 | 1 | 1 | 0 | 0 | 1 | 1 | 2 |
| 0 | 0 | 1 | 1 | 0 | 1 | 1 | 0 | 3 |
| 0 | 0 | 1 | 1 | 1 | 1 | 1 | 0 | 3 |
| 0 | 0 | 1 | 1 | 1 | 0 | 1 | 0 | 3 |
| 0 | 0 | 1 | 0 | 0 | 0 | 1 | 0 | 3 |
| 0 | 0 | 1 | 0 | 0 | 1 | 1 | 0 | 3 |
| 0 | 0 | 1 | 0 | 1 | 1 | 1 | 0 | 3 |
| 0 | 0 | 1 | 0 | 1 | 0 | 1 | 0 | 3 |
| 0 | 1 | 0 | 0 | 0 | 0 | 0 | 1 | 1 |
| 0 | 1 | 0 | 0 | 0 | 1 | 1 | 1 | 2 |
| 0 | 1 | 0 | 0 | 1 | 1 | 1 | 0 | 3 |
| 0 | 1 | 0 | 0 | 1 | 0 | 1 | 0 | 3 |
| 0 | 1 | 0 | 1 | 0 | 0 | 1 | 1 | 2 |
| 0 | 1 | 0 | 1 | 0 | 1 | 1 | 0 | 3 |
| 0 | 1 | 0 | 1 | 1 | 1 | 1 | 0 | 3 |
| 0 | 1 | 0 | 1 | 1 | 0 | 1 | 0 | 3 |
| 0 | 1 | 1 | 1 | 0 | 0 | 1 | 0 | 3 |
| 0 | 1 | 1 | 1 | 0 | 1 | 1 | 0 | 3 |
| 0 | 1 | 1 | 1 | 1 | 1 | 1 | 0 | 3 |
| 0 | 1 | 1 | 1 | 1 | 0 | 1 | 0 | 3 |
| 0 | 1 | 1 | 0 | 0 | 0 | 1 | 0 | 3 |
| 0 | 1 | 1 | 0 | 0 | 1 | 1 | 0 | 3 |
| 0 | 1 | 1 | 0 | 1 | 1 | 1 | 0 | 3 |
| 0 | 1 | 1 | 0 | 1 | 0 | 1 | 0 | 3 |

FIG.4A

| D | E | F | G | H | I | O1 | O2 | SUM |
|---|---|---|---|---|---|----|----|-----|
| 1 | 1 | 0 | 0 | 0 | 0 | 1 | 1 | 2 |
| 1 | 1 | 0 | 0 | 0 | 1 | 1 | 0 | 3 |
| 1 | 1 | 0 | 0 | 1 | 1 | 1 | 0 | 3 |
| 1 | 1 | 0 | 0 | 1 | 0 | 1 | 0 | 3 |
| 1 | 1 | 0 | 1 | 0 | 0 | 1 | 0 | 3 |
| 1 | 1 | 0 | 1 | 0 | 1 | 1 | 0 | 3 |
| 1 | 1 | 0 | 1 | 1 | 1 | 1 | 0 | 3 |
| 1 | 1 | 0 | 1 | 1 | 0 | 1 | 0 | 3 |
| 1 | 1 | 1 | 1 | 0 | 0 | 1 | 0 | 3 |
| 1 | 1 | 1 | 1 | 0 | 1 | 1 | 0 | 3 |
| 1 | 1 | 1 | 1 | 1 | 1 | 1 | 0 | 3 |
| 1 | 1 | 1 | 1 | 1 | 0 | 1 | 0 | 3 |
| 1 | 1 | 1 | 0 | 0 | 0 | 1 | 0 | 3 |
| 1 | 1 | 1 | 0 | 0 | 1 | 1 | 0 | 3 |
| 1 | 1 | 1 | 0 | 1 | 1 | 1 | 0 | 3 |
| 1 | 1 | 1 | 0 | 1 | 0 | 1 | 0 | 3 |
| 1 | 0 | 0 | 0 | 0 | 0 | 1 | 0 | 3 |
| 1 | 0 | 0 | 0 | 0 | 1 | 1 | 0 | 3 |
| 1 | 0 | 0 | 0 | 1 | 1 | 1 | 0 | 3 |
| 1 | 0 | 0 | 0 | 1 | 0 | 1 | 0 | 3 |
| 1 | 0 | 0 | 1 | 0 | 0 | 1 | 0 | 3 |
| 1 | 0 | 0 | 1 | 0 | 1 | 1 | 0 | 3 |
| 1 | 0 | 0 | 1 | 1 | 1 | 1 | 0 | 3 |
| 1 | 0 | 0 | 1 | 1 | 0 | 1 | 0 | 3 |
| 1 | 0 | 1 | 1 | 0 | 0 | 1 | 0 | 3 |
| 1 | 0 | 1 | 1 | 0 | 1 | 1 | 0 | 3 |
| 1 | 0 | 1 | 1 | 1 | 1 | 1 | 0 | 3 |
| 1 | 0 | 1 | 1 | 1 | 0 | 1 | 0 | 3 |
| 1 | 0 | 1 | 0 | 0 | 0 | 1 | 0 | 3 |
| 1 | 0 | 1 | 0 | 0 | 1 | 1 | 0 | 3 |
| 1 | 0 | 1 | 0 | 1 | 1 | 1 | 0 | 3 |
| 1 | 0 | 1 | 0 | 1 | 0 | 1 | 0 | 3 |

FIG.4B

CIRCUIT AND METHOD FOR DETERMINING GREATER THAN OR EQUAL TO THREE OUT OF SIXTY-SIX

BACKGROUND OF THE INVENTION

1. Field of the Invention

The present invention generally relates to an apparatus and method for digital addition used in memory array testing and more particularly relates to determining whether three or more defective bits are present in a sixty-six bit memory array.

2. Description of the Related Art

Digital addition processes provide a method for "carrying" when the capacity of a column is exceeded. For example, in a decimal system for adding two numbers, when the result of addition in a column exceeds nine, a one must be carried to the next column. Also, for every column except the lowest ordered one, provision must be made for receiving a number carried from the preceding lower order column. The carry operation occurs frequently in addition.

One of the simplest forms of adders is the ripple-carry adder in which a single carry from one column to the next is provided at each level, starting with the lowest order column. Although simple, the ripple-carry adder is relatively slow because of the relatively large number of levels or stages that are required. Since the circuits of one level cannot do their operations until those of the previous level have completed theirs, the time required for addition is generally determined by the number of levels.

One technique that has been employed to expedite addition separates the function of simple addition from that of the calculation of the carry bits. Probably the most common example today is the carry look-ahead adder. A carry look-ahead adder circuitry is obtained by considering the Boolean functions that define addition and applying algebra to them. In this process, two Boolean terms are usually introduced, called generate and propagate. The carry look-ahead method of addition has been standard for many years with minor changes.

It is desirable to provide digital circuitry that is able to perform these functions as fast as possible and without using great amounts of chip space. Conventional n-bit ripple carry adder circuitry is very slow and a carry-look-ahead adder is chip real estate intensive. It is further desirable to perform a greater than or equal to three of sixty-six calculation in less than 5 nanoseconds. More specifically, it is desirable to know if three or greater bits out of sixty-six is low (e.g., is defective) because a standard memory array has sixty-four Primary Data Lines (PDL) and two redundant lines. If three or more fails occur on a word line, then the two redundant PDLs cannot be used to perform the repair of the three defects. The repair then must be performed with a redundant word line.

SUMMARY OF THE INVENTION

In view of the foregoing and other problems of the conventional methods, it is, therefore, an object of the present invention to provide a circuit for indicating a status of a plurality of input signals. The circuit may include a plurality of pre-sum circuits that receive the plurality of input signals. Each pre-sum circuit may output two pre-sum output signals. The circuit may also include a plurality of first stage circuits. Each first stage circuit may receive two pre-sum output signals and outputting two first stage output signals. The circuit may also include a plurality of second stage circuits adapted to receive the first stage output signals. Each of the second stage circuits may output second stage output signals. A final stage circuit may be adapted to receive the second stage output signals and output two final stage output signals. The two final stage output signals represent the status of the plurality of input signals.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein:

FIGS. 4A and 4B are a logic table of the second stage circuit of FIG. 3;

DETAILED DESCRIPTION OF PREFERRED EMBODIMENTS OF THE INVENTION

The present invention includes several circuit portions that are appropriately connected together in order to determine if greater than or equal to 3 of 66 input lines are set low. In other words, the present invention determines whether three more of sixty-six input lines from a sixty-six bit memory array are set low (i.e., whether they fail). The circuitry may also be easily adapted to determine whether three or more of sixty-six input lines are high (i.e., whether they fail if they are high). This unique circuit structure preferably performs the greater than or equal to three of sixty-six calculation in less than five nanoseconds by processing a result in fifteen gates (i.e., 2.7 nanoseconds at 180 ps per gate in CMOS7LD technology) and takes up a minimum of the chip real estate to perform the function.

Figures 1, 2:
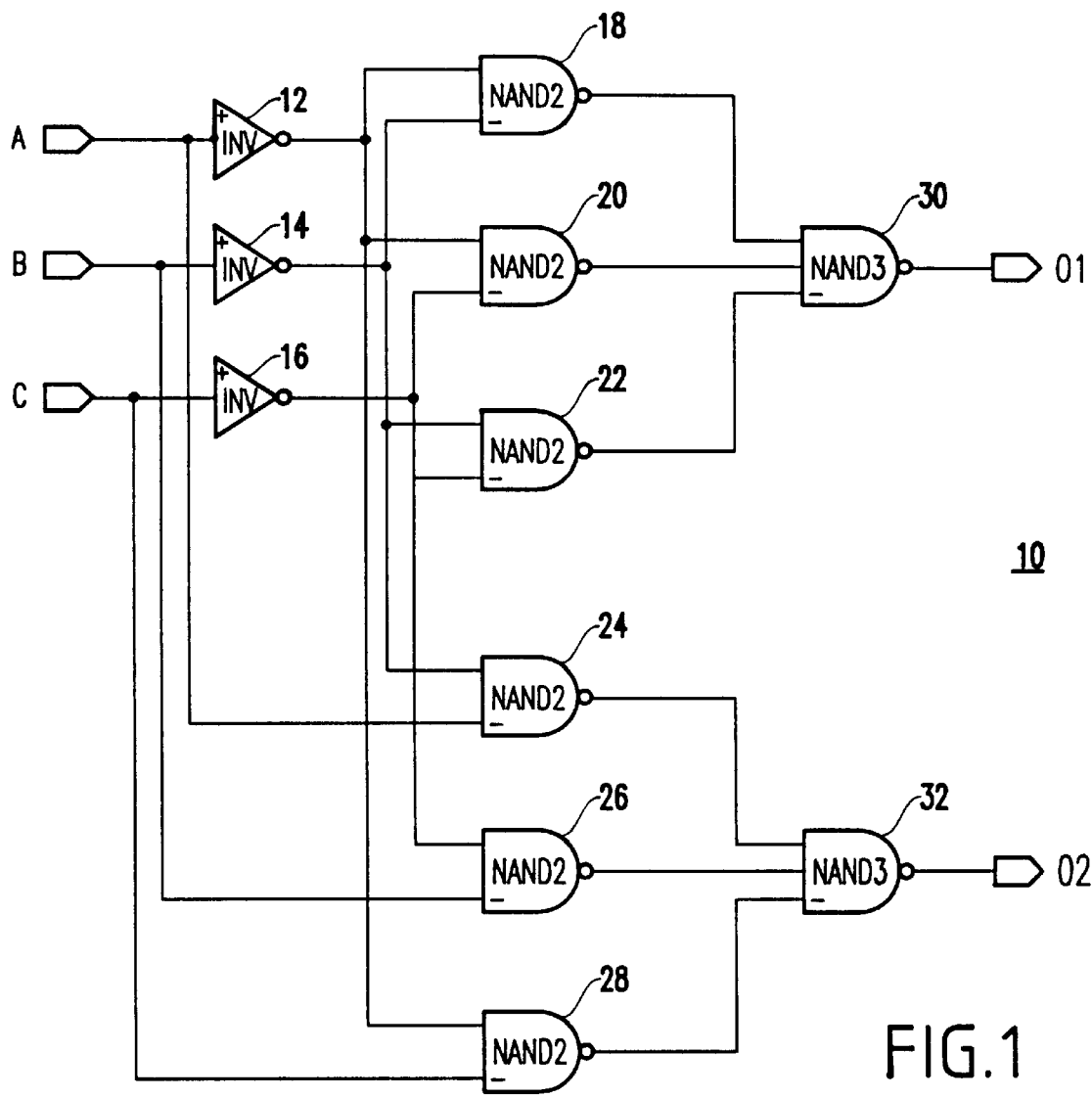
FIG. 1 is a pre-sum circuit according to the present invention.
FIG. 2 is a logic table of the pre-sum circuit of FIG. 1.

FIG. 1 shows a pre-sum circuit 10 (also called first stage circuit) according to the present invention. The pre-sum circuit 10 receives three input signals A, B and C. The input signals A, B and C are three of the sixty-six input signals. The pre-sum circuit 10 outputs two single-bit output signals O1 and O2 based on the logic within the pre-sum circuit 10. The pre-sum circuit 10 preferably includes three invertors 12, 14 and 16 that respectively receive each of the inputs A, B and C. The pre-sum circuit 10 also preferably includes NAND gates 18, 20, 22, 24, 26 and 28. Outputs from the three NAND gates 18, 20 and 22 are input to the NAND gate 30, which outputs the single-bit output signal O1. Outputs from the three NAND gates 24, 26 and 28 are input to the NAND gate 32, which outputs the single-bit output signal O2.

FIG. 2 shows a logic table of the pre-sum circuit 10 shown in FIG. 1. The two single-bit output signals O1 and O2 represent the number of input lines that were set low. For example, the signal O1 being zero (i.e., low) and the signal O2 being zero means that none (i.e., 0) of the input lines was set low (i.e., none fails). The signal O1 being zero and the signal O2 being a one (i.e., high) indicates that one of the three input lines A, B and C was set low (i.e., one fails). The signal O1 being one and the signal O2 being one indicates that two input lines were set low (i.e., two fail). Finally, the signal O1 being one and the output signal O2 being zero indicates that three input lines were set low (i.e., three fail).

Figure 9:
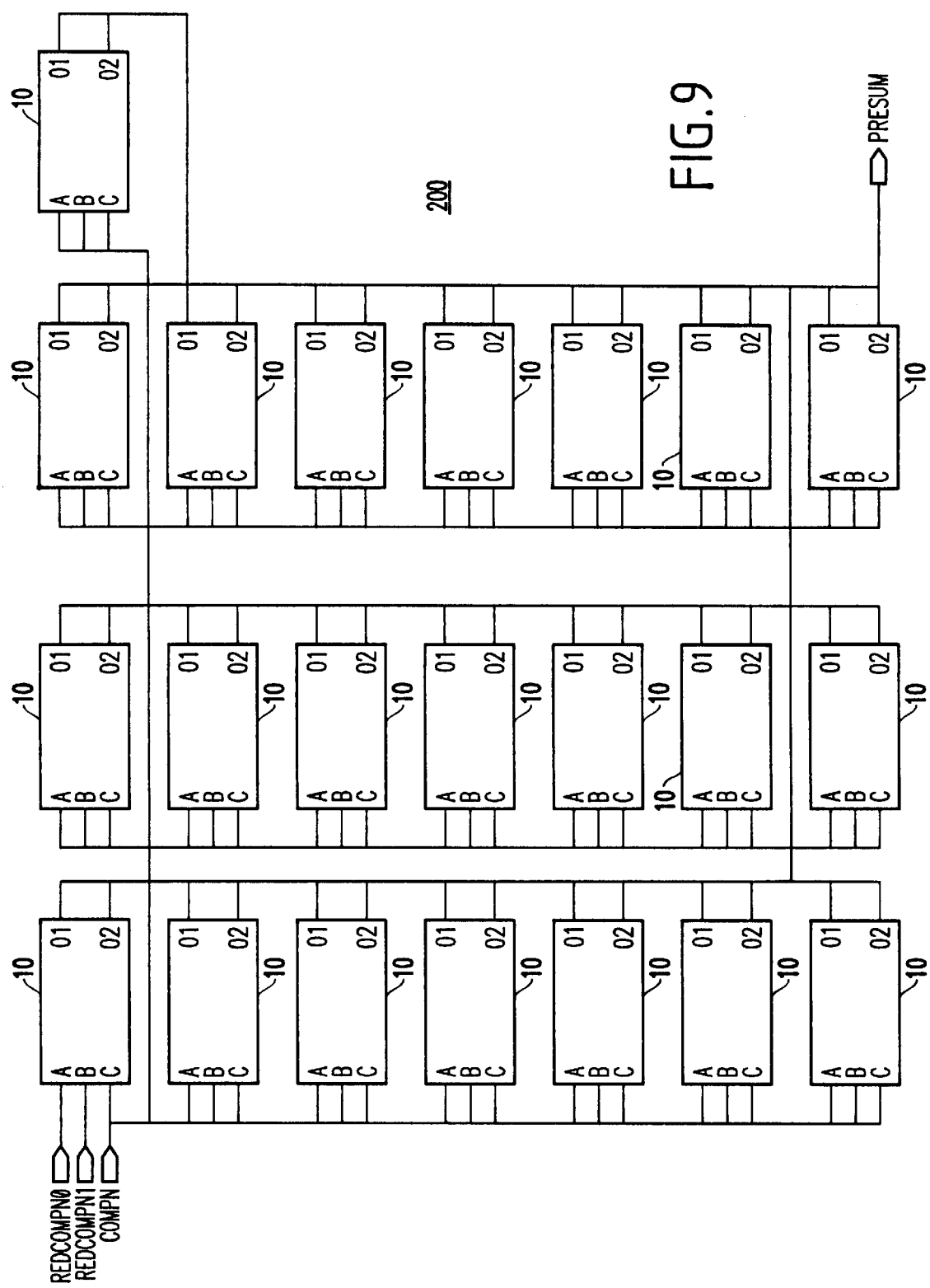
FIG. 9 shows how each of the circuits may be chained together.

The present invention preferably analyzes sixty-six input lines. Each pre-sum circuit 10 preferably analyzes three of the sixty-six input lines. Therefore, the present invention preferably includes twenty-two different pre-sum circuits 10, as shown in FIG. 9, where each pre-sum circuit 10 separately analyzes three input signals. Each pre-sum circuit 10 separately determines two single-bit output signals O1 and O2 to determine the number of the input lines that were set low (i.e., the number that fail).

Figure 3:
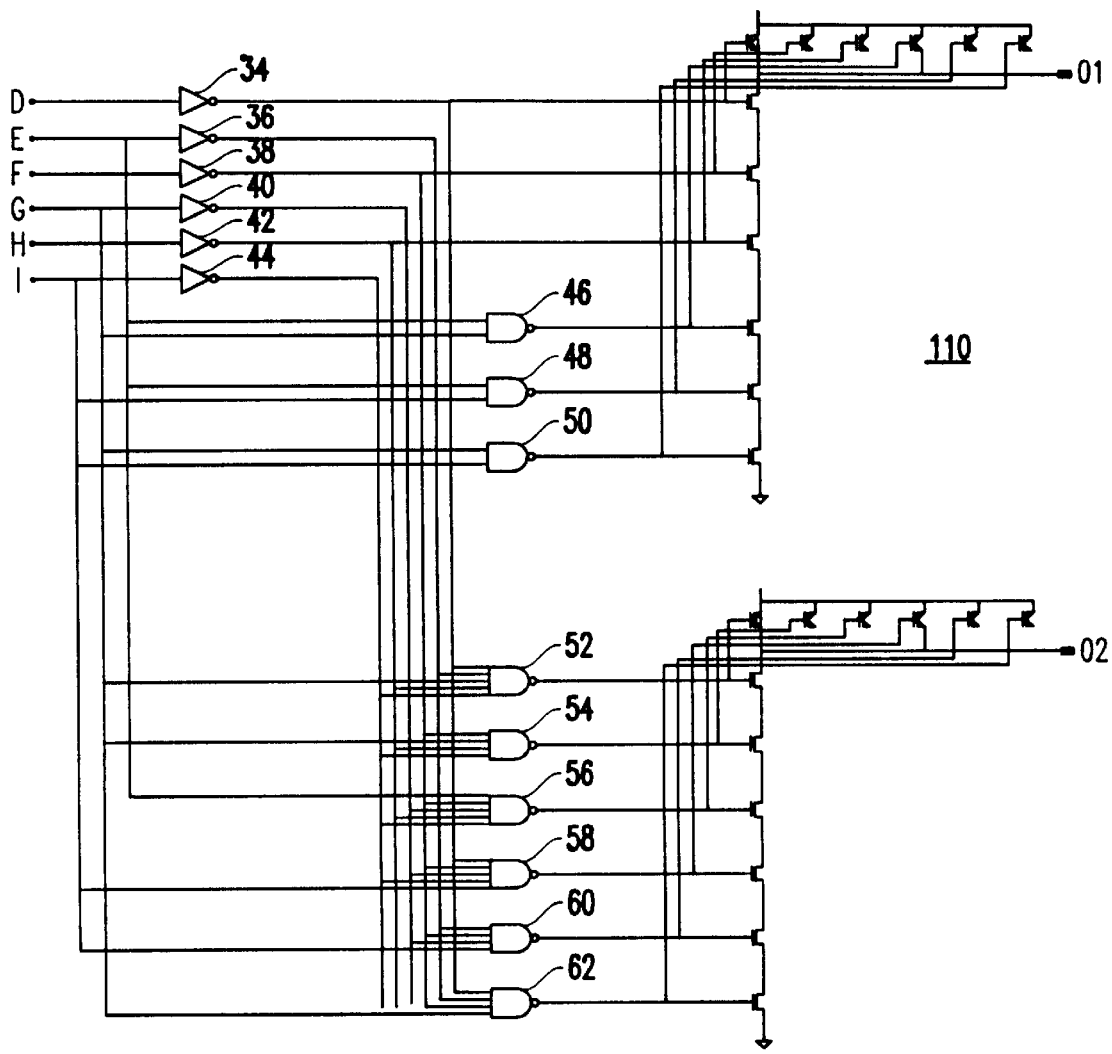
FIG. 3 is a second stage circuit according to the present invention.

FIG. 3 shows a second stage circuit 110 that follows one of the pre-sum circuits 10 according to the present invention. The second stage circuit 110 receives six input signals D, E, F, G, H and I. These six input signals correspond to the single-bit output signals O1 and O2 of three separate pre-sum circuits 10 (e.g., nine bits of the sixty-six bit array). For example, input signals D and E correspond to output signals O1 and O2, respectively, from a first pre-sum circuit 10. Input signals F and G correspond to output signals O1 and O2, respectively, from a second pre-sum circuit 10. Finally, input signals H and I correspond to output signals O1 and O2, respectively, from a third pre-sum circuit 10. The six input signals D, E, F, G, H and I are applied to the appropriate logic of the second stage circuit 110 to output the single-bit output signals O1 and O2. As shown in FIG. 3, the second stage circuit 10 preferably includes inverters 34, 36, 38, 40, 42 and 44 as well as NAND gates 46, 48, 50, 52, 54, 56, 58, 60 and 62. The second stage circuit 110 also preferably includes the respective transistors that are shown in FIG. 3 to output each of the single-bit output signals O1 and O2. As one skilled in the art would understand, the transistor circuitry is appropriately configured to execute the function in the logic table of FIGS. 4A and 4B.

Figure 10:
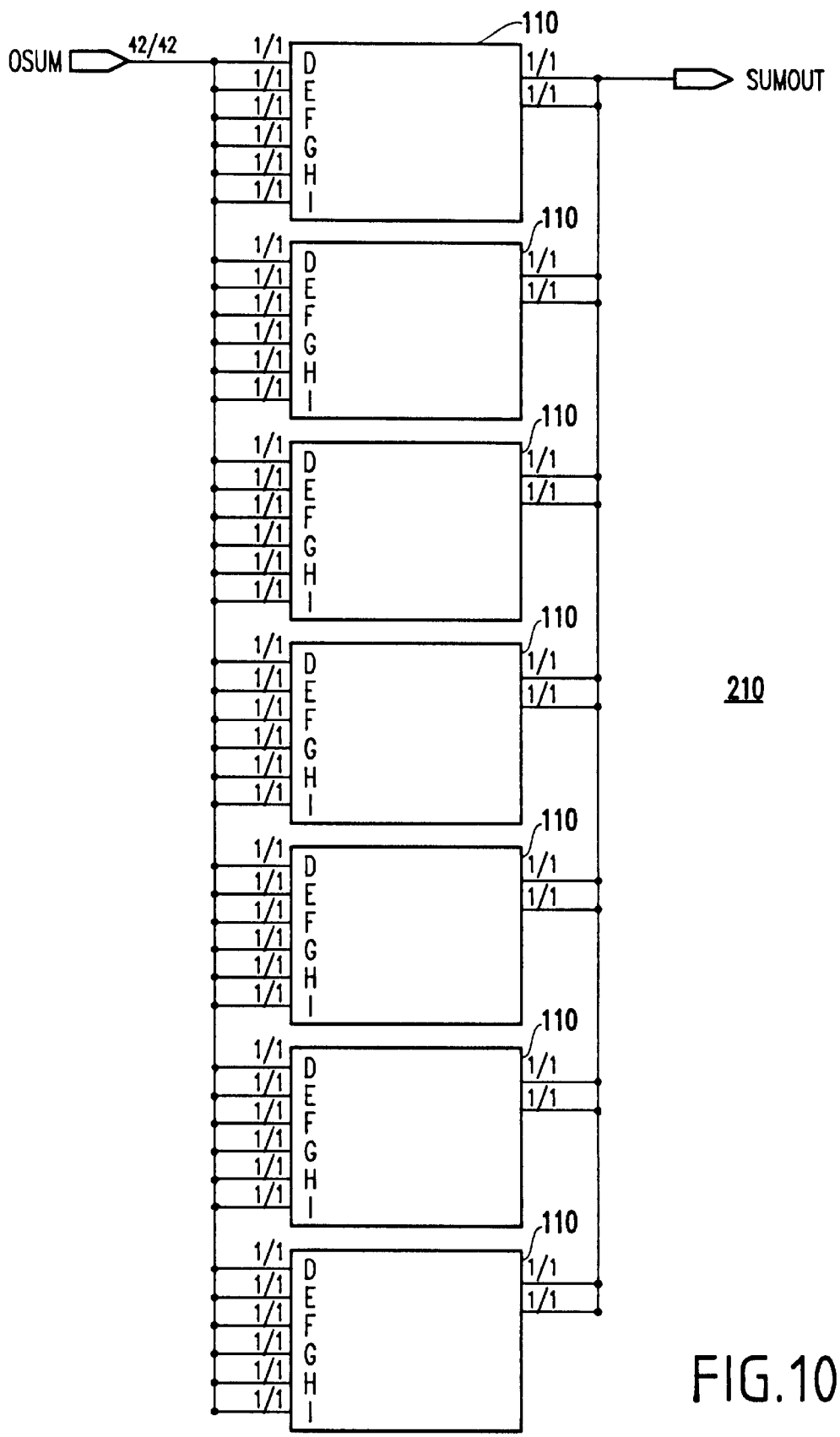
FIG. 10 shows how each of the circuits may be chained together.
Figure 11:
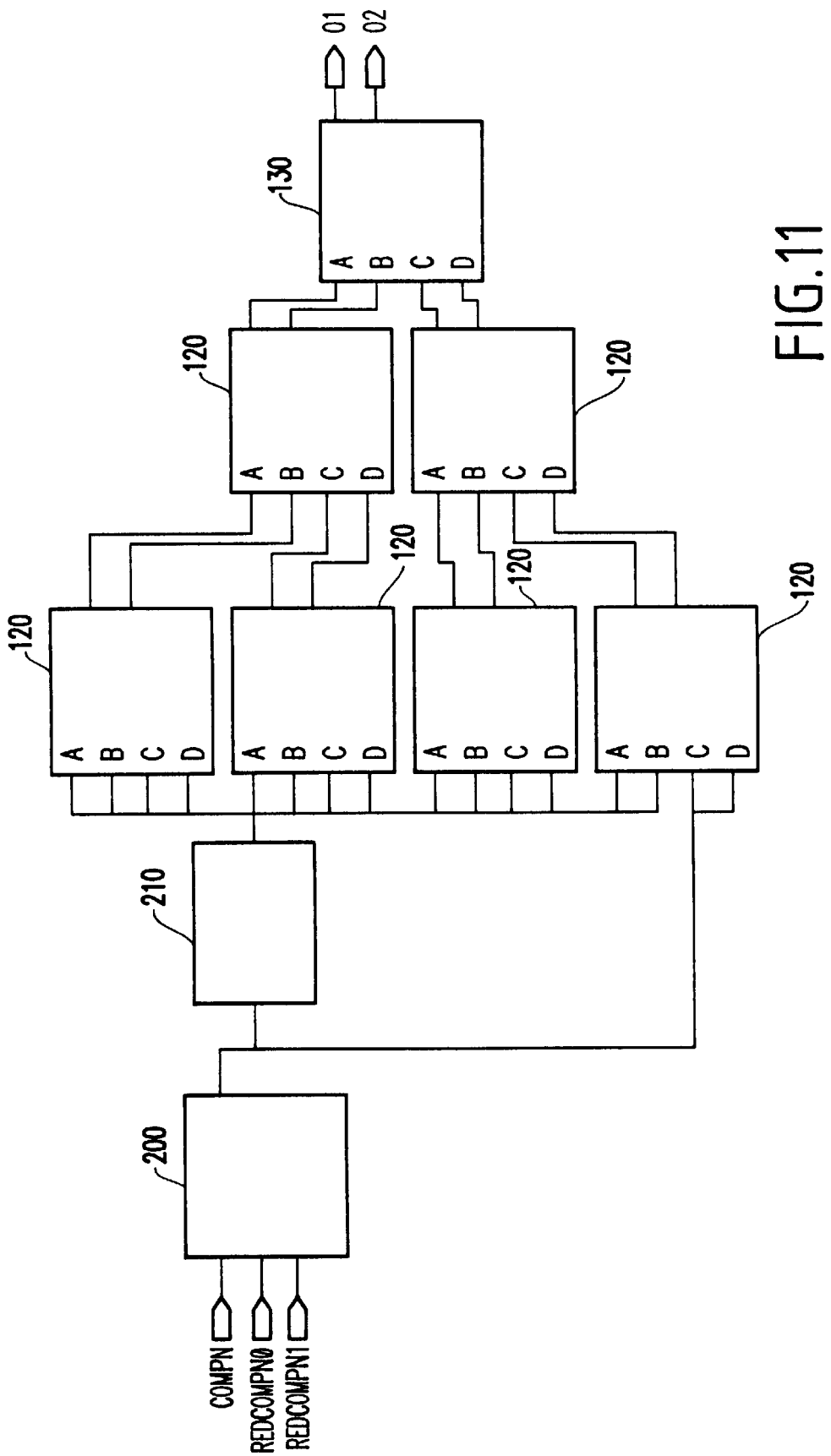
FIG. 11 shows how each of the circuits may be chained together.

FIGS. 4A and 4B show a logic table of the second stage circuit 110 shown in FIG. 3. In particular, FIGS. 4A and 4B show the various combinations of the input signals D, E, F, G, H and I and the respective single-bit output signals O1 and O2. The configuration of the single-bit output signals O1 and O2 in turn corresponds to the number of input lines that are low. Because the second stage circuit 110 receives two inputs from each of three pre-sum circuits 10, the output signals O1 and O2 correspond to a total of nine (of sixty-six) originally input signals. As shown in FIG. 10, discussed below, the invention uses seven of the second stage circuits 110 to receive input from 21 of the 22 first stage circuits shown in FIG. 9. The output from the 22$^{nd}$ first stage circuit is processed as shown in FIG. 11, discussed below.

A unique feature of the present invention is that one does not use a standard binary scramble to represent the numbers 0, 1, 2 or 3. This reduces the number of logic transitions and therefore simplifies the logic. Furthermore, in order to reduce the amount of logic, if the number of input lines set low is greater than or equal to 3, then the result is 3. Thus, only a single bit output signal is generated with the invention. In other words, it is not necessary to count any higher than three since the present invention is concerned with greater than or equal to 3. That is, even if all nine input signals are low, the single-bit output signal O1 and O2 of the second stage circuit 110 will, at most, indicate a 1 and 0, respectively, indicating three defects.

Figures 5, 6:
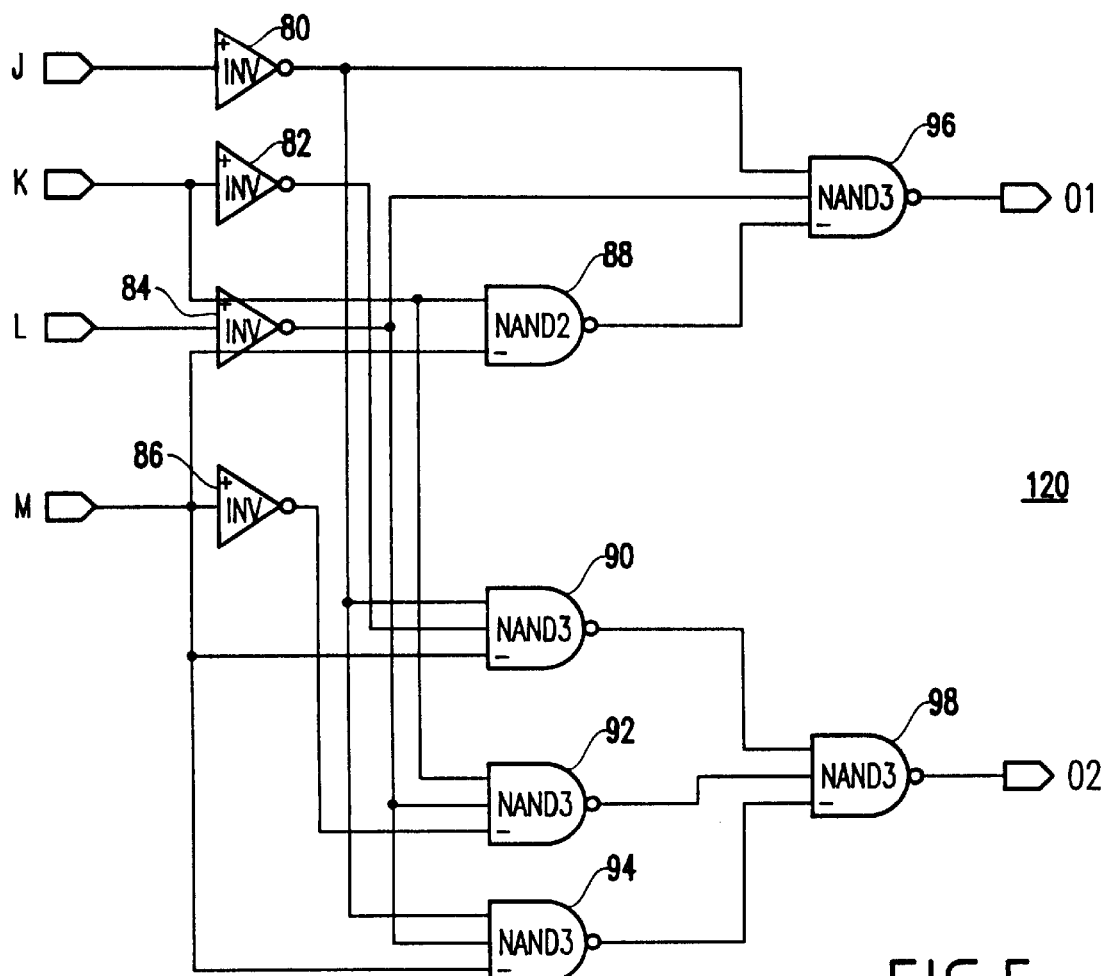
FIG. 5 is a third stage circuit according to the present invention.
FIG. 6 is a logic table of the third stage circuit of FIG. 5.

FIG. 5 shows a third stage circuit 120 that receives four input signals J, K, L and M and outputs two single-bit output signals O1 and O2. In the third stage circuit 120, the input signals J and K correspond to the single-bit output signals O1 and O2 from one of the second stage circuits 110 while the input signals L and M correspond to the single-bit output signals O1 and O2 from another one of the second stage circuits 110. In other words, the J and K input signals correspond to the single-bit output signals O1 and O2, respectively, from one of the second stage circuits 110 while the input signals L and M correspond to the single-bit output signals O1 and O2, respectively, from another one of the second stage circuits 110.

The third stage circuit 120 processes the input signals J, K, L and M through the logic circuits shown in FIG. 5 and outputs the single-bit output signals O1 and O2. The third stage circuit 120 preferably includes invertors 80, 82, 84 and 86 that receive the input signals J, K, L and M, respectively. Signals are applied through NAND gates 88, 90, 92 and 94 and are eventually output through NAND gates 96 and 98 as the single-bit output signals O1 and O2.

FIG. 6 shows a logic table of the third stage circuit 120 based on different combinations of the four input signals J, K, L and M. The logic table shows the resulting single stage output signals O1 and O2 that use the similar translation as set forth above. That is, a 00 combination represents a sum of zero, a 01 combination represents a sum of one, a 11 combination represents a sum of two and a 10 combination represents a sum of three or more.

As shown in FIG. 11, discussed below, the invention uses four of the third stage circuits 120 to process the output from the seven second stage circuits 110 and the output from the 22$^{nd}$ first stage circuit.

Figures 7, 8:
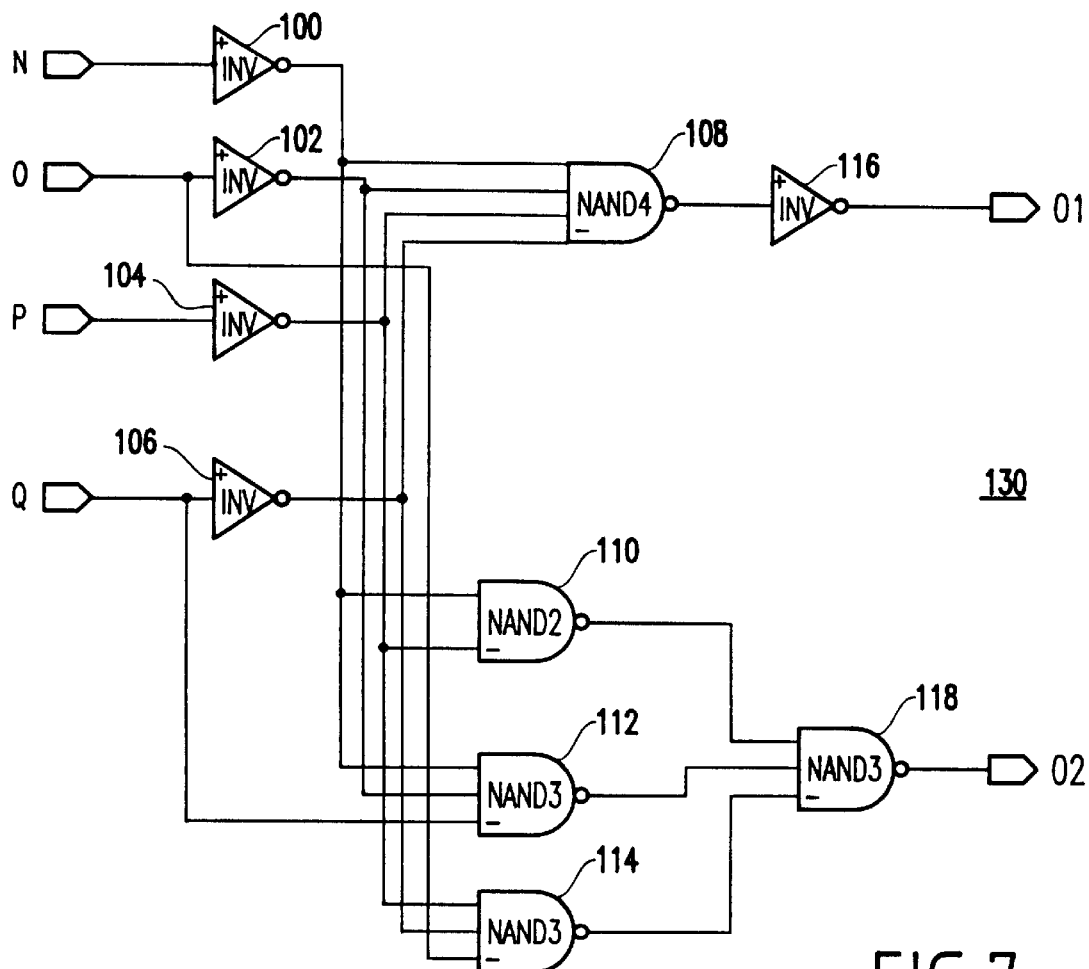
FIG. 7 is a fourth stage circuit according to the present invention.
FIG. 8 is a logic table of the fourth stage circuit of FIG. 7.

FIG. 7 similarly shows the fourth stage circuit 130 that receives the input signals N, O, P and Q and outputs two single-bit signals O1 and O2. The input signals N, O, P and Q correspond to the single-bit output signals O1 and O2 from two third stage circuits 120. For example, the input signals N and 0 of the fourth stage circuit 130 correspond to the single-bit output signals O1 and O2, respectively, from a third stage circuit 120 and the input signals P and Q of the fourth stage circuit 130 correspond to the single-bit output signals O1 and O2, respectively, from another third stage circuit 120. The input signals N, O, P and Q are applied through the appropriate logic circuits shown in FIG. 7 to output two single-bit output signals O1 and O2. The fourth stage circuit 130 preferably includes invertors 100, 102, 104 and 106, NAND gates 110, 112, 114, 108 and 118 and the invertor 116 as shown in FIG. 7.

FIG. 8 shows a logic circuit table of the fourth stage circuit 130 based on different combinations of the four input signals N, O, P and Q and the respective output signals O1 and O2. The single-bit output signals O1 and O2 determine the resulting sum of the circuits that have been set low. The circuit uses the same translation as discussed above in which the output bits O1 and O2 are used to correspond to the sum of 0, 1, 2 or 3. Furthermore, in order to reduce the amount of logic, any sum of circuits greater than or equal to three results in a sum of only three.

FIGS. 9, 10 and 11 show the stages of each of the previous circuits that are chained together. That is, FIG. 9 shows circuitry 200 of how twenty-two pre-sum circuits 10 are chained together to reduce sixty-six input lines to twenty-two pairs of O1/O2 output lines. These 22 output lines are input to the next stage shown in FIG. 10. FIG. 10 shows circuitry 210 that receives twenty-one pairs of O1/O2 output lines (from FIG. 9) into seven of the second stage circuits 110 and reduces the number of outputs down to seven pairs of O1/O2 output lines for the next stage shown in FIG. 11. FIG. 11 shows how the circuitry 200 (FIG. 9) is connected to the circuit 210 (FIG. 10) to produce eight pairs of O1/O2 output lines (seven pairs of O1/O2 output lines from FIG. 10, and one pair left over from FIG. 9 (e.g., the $22^{nd}$ output line)). The inputs are fed into four third stage circuits 120, whose outputs are fed into two additional third stage circuits 120 as shown in FIG. 11. This reduces the signals down to two pairs of output lines O1 and O2. These two pairs of output lines O1 and O2 are finally reduced by the fourth stage circuit 130 that outputs O1 and O2. These final outputs O1/O2 represent whether three (or more) of the original input lines fail.

These last three figures basically show how the building blocks described in the previous figures are brought together to reduce sixty-six input lines down to a sum of O1 (greater than one of the lines are low) and O2 (three or more of the lines are low).

The worst case delay through the greater than or equal to 3 of 66 circuits is 15 gate delays. This translates into a 2.7 nanosecond delay for CMOS7LD technology. Simulations have shown results having a delay of 1.27 nanoseconds at nominal process, 2.5 volts and a delay of 3.1 nanoseconds worst case process at 1.9 volts. The circuit preferably occupies only an area of 580×86 micrometers in CMOS7LD rules (0.25 micrometer rules). Accordingly, the present invention performs a greater than or equal to three of sixty-six operation by trading off between speed (canry-look-ahead adder) and size (n-bit ripple carry adder).

The present invention provides a true redundancy solution. In other words, when three or more bits on a word line fail, the fail will be replaced with a word line, since only two redundant PDLs are available to replace any fails in the sixty-four Primary Data Lines. The inventive circuit performs the greater than or equal to three operation in an area that is smaller than the previous greater than or equal to two and also within the time window necessary for the operation of the circuitry.

The concept of using a non-standard decode and ignoring any sums over a certain limit (i.e., preferably three) to reduce logic can be used in other situations as well involving sums greater than three. The advantage of using this method is that it provides a faster way of summation than by using a ripple carry adder, without the massive area penalty in physical layout that results from a carry look ahead design point.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention. For example, while the above described circuit describes how to determine if greater than or equal to three of the input bits are low (i.e., fail), it may be easily adapted to determine if greater than or equal to three of the input bits have failed because they are high.

Further, while the invention is described above with respect to a 64 bit memory array having two redundant memory cells (totaling a 66 bit memory array), as would be known by one ordinarily skilled in the art given this disclosure, the invention is equally applicable to any size array device which includes redundant devices. Further, while the invention has been described above with respect to an array that includes two redundant devices, it is equally applicable to an array that includes three or more redundant devices. More specifically, one ordinarily skilled in the art would understand (after being presented with this disclosure) that the circuits shown herein could be modified to indicate four or more, five or more, six or more, etc. defective devices using the minimum possible bit-size output signal for each given situation. Therefore, the invention is not limited to a 66 bit array includes two redundant devices, but instead is applicable to any size and type array which includes any number of redundant devices.

What is claimed is:

1. A circuit for indicating whether at least three of a plurality of input signals fail, said circuit comprising:
   a plurality of pre-sum circuits that receive said plurality of input signals and output a plurality of pre-sum output signals, each pre-sum circuit outputting two of said pre-sum output signals;
   a plurality of middle stage circuits that receive said plurality of pre-sum output signals and output a plurality of middle stage output signals; and
   a final stage circuit that receives signals corresponding to said middle stage output signals and outputs two final stage output signals, said two final stage output signals representing whether zero, one, two or at least three of said plurality of input signals have failed.

2. The circuit of claim 1, wherein said plurality of input signals comprise sixty-six input signals.

3. The circuit of claim 1, wherein said plurality of pre-sum circuits comprises twenty-two pre-sum circuits each of which outputs two respective pre-sum output signals.

4. The circuit of claim 1, wherein each two pre-sum output signals from a respective pre-sum circuit represents whether zero, one, two or three input signals to the respective pre-sum circuit have failed.

5. A method for indicating whether at least three of a plurality of input signals fail, said method comprising:
   receiving said plurality of input signals in a plurality of pre-sum circuits;
   outputting two pre-sum output signals from each pre-sum circuit;
   receiving each of said pre-sum output signals in a plurality of middle stage circuits;
   outputting two middle stage output signals from each middle stage circuit;
   receiving signals corresponding to said middle stage signals in a final stage circuit; and
   outputting two final stage output signals from said final stage circuit, said two final stage output signals representing one of: a) less than three of said input signals fail; and b) three or more of said input signals fail.

6. The method of claim 5, wherein said plurality of input signals comprise sixty-six input signals.

7. The method of claim 5, wherein each of said input signals fails if said respective input signal is low.

8. The method of claim 5, wherein each of said input signals fails if said respective input signal is high.

9. The method of claim 5, wherein each pre-sum circuit receives three input signals and outputs two respective pre-sum output signals that represent whether zero, one, two or three of said three input signals have failed.

10. The method of claim 5, wherein said plurality of middle stage circuits comprise a plurality of first stage circuits and a plurality of second stage circuits, said method further comprising outputting signals from said first stage circuits to said second stage circuits.

11. A circuit for indicating that up to three data lines in a memory array are defective, said circuit comprising:
- a plurality of hierarchical adder stages, each stage operatively connected to said data lines and each stage outputting intermediary two-bit output signals to the next stage; and
- a final hierarchical stage outputting a final two-bit output signal indicating between zero and three defective data lines.

12. The circuit in claim 11, wherein a first stage of said hierarchical adder stages is connected to three of said data lines and outputs a first two-bit output signal indicating between zero and three defective data lines of three data lines.

13. The circuit in claim 12, wherein a second stage of said hierarchical adder stages is connected to three of said first stages and outputs a second two-bit output signal indicating between zero and three defective data lines of nine data lines.

14. The circuit in claim 13, wherein a third stage of said hierarchical adder stages is connected to two of said second stages and outputs a third two-bit output signal indicating between zero and three defective data lines of eighteen data lines.

15. The circuit in claim 11, wherein an indication of three defective data lines comprises an indication of three or more defective data lines.

16. The circuit in claim 11, wherein said memory array includes two redundant memory devices.

17. A circuit for indicating a status of sixty-six input signals, said circuit comprising:
- a plurality of pre-sum circuits that receive the plurality of input signals, each pre-sum circuit outputting two pre-sum output signals;
- a plurality of first stage circuits, each receiving two pre-sum output signals and outputting two first stage output signals;
- a plurality of second stage circuits adapted to receive said first stage output signals, each of said second stage circuits outputting second stage output signals; and
- a final stage circuit adapted to receive said second stage output signals and output two final stage output signals, said two final stage output signals representing whether at least three of said sixty-six input signals are low.

18. A circuit for indicating a status of sixty six input signals, said circuit comprising:
- a plurality of pre-sum circuits that receive the plurality of input signals, each pre-sum circuit outputting two pre-sum output signals;
- a plurality of first stage circuits, each receiving two pre-sum output signals and outputting two first stage output signals;
- a plurality of second stage circuits adapted to receive said first stage output signals, each of said second stage circuits outputting second stage output signals; and
- a final stage circuit adapted to receive said second stage output signals and output two final stage output signals, said two finl stage output signals representing whether at least three of said sixty-six input signals are high.

* * * * *